United States Patent [19]

Schulz

[11] Patent Number: 5,315,262
[45] Date of Patent: May 24, 1994

[54] DEMODULATOR ALIGNMENT METHOD AND APPARATUS

[75] Inventor: Gary Schulz, Cary, Ill.

[73] Assignee: Motorola, Inc., Schaumburg, Ill.

[21] Appl. No.: 941,286

[22] Filed: Sep. 4, 1992

[51] Int. Cl.$^5$ ............................................. H03D 3/00
[52] U.S. Cl. ................................... 329/302; 329/319; 375/51; 375/99
[58] Field of Search ............... 329/300, 302, 318, 319, 329/323; 375/45, 51, 60, 62, 88, 99

[56] References Cited

U.S. PATENT DOCUMENTS

| | | | |
|---|---|---|---|
| 4,987,374 | 1/1991 | Burke | 329/302 |
| 5,053,717 | 10/1991 | Schulz et al. | 329/300 |
| 5,097,221 | 3/1992 | Miller | 329/319 X |

*Primary Examiner*—David Mis
*Attorney, Agent, or Firm*—Val Jean F. Hillman

[57] ABSTRACT

A demodulator alignment method and apparatus (400) employs an alignment signal generator (401–405) to generate an alignment signal (417) in response to a modulation reference signal (413). The alignment signal (417) is demodulated by a demodulator circuit (402), having a voltage controlled delay element (404) to produce a demodulated alignment signal (419) having distortion components. The demodulated alignment signal (419) is then coupled to a filter (406) which isolates the distortion components. A detector (408) is then employed to detect the isolated distortion components. Next, an error amplifier (410) compares the detected distortion to a reference (430), generates an error signal (450) and applies the error signal (450) to a sampling circuit (412). The sampling circuit (412) samples the error signal (450) and applies the sampled error signal (460) to the voltage controlled delay element (404) as a correction voltage in order to minimize the distortion components at the demodulator output (419) during data recovery.

25 Claims, 4 Drawing Sheets

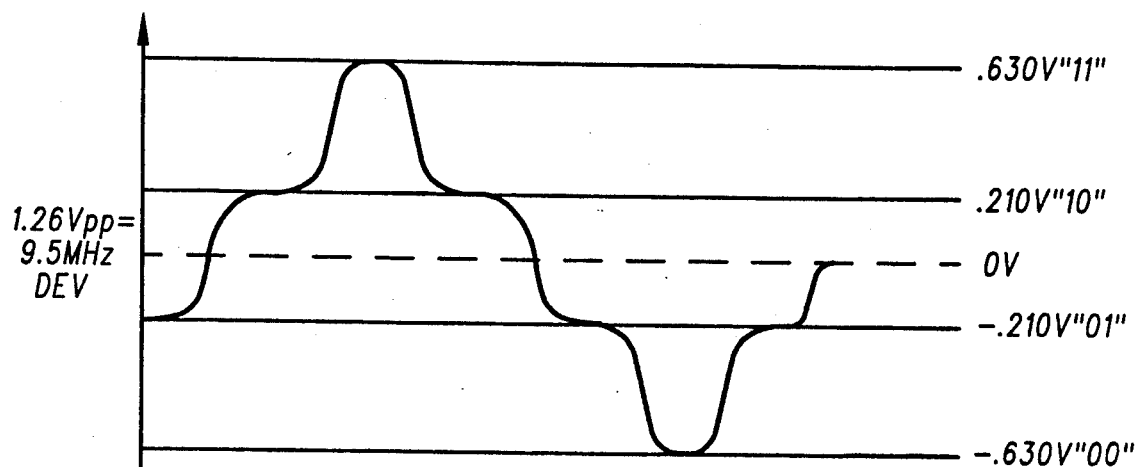
Fig.1
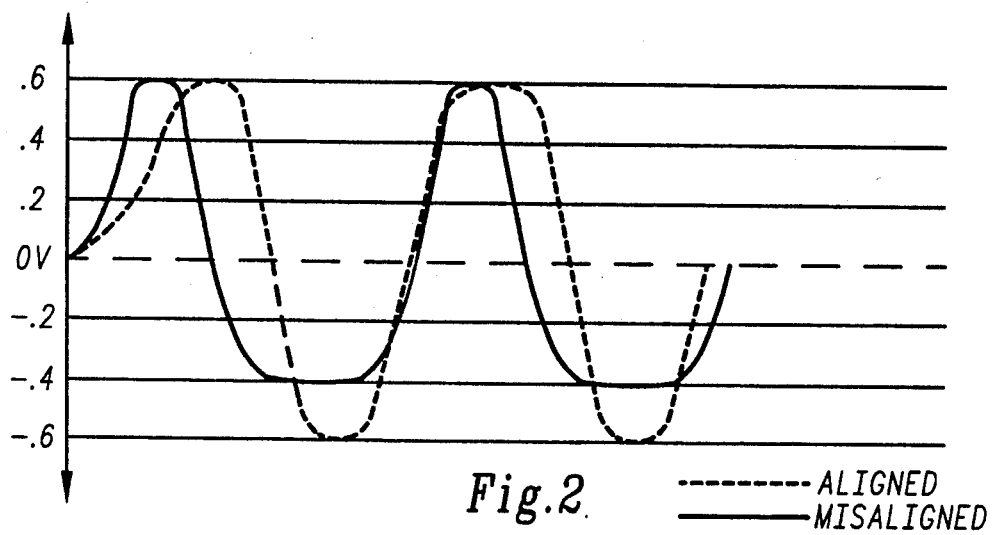
Fig.2 ---------- ALIGNED
———— MISALIGNED
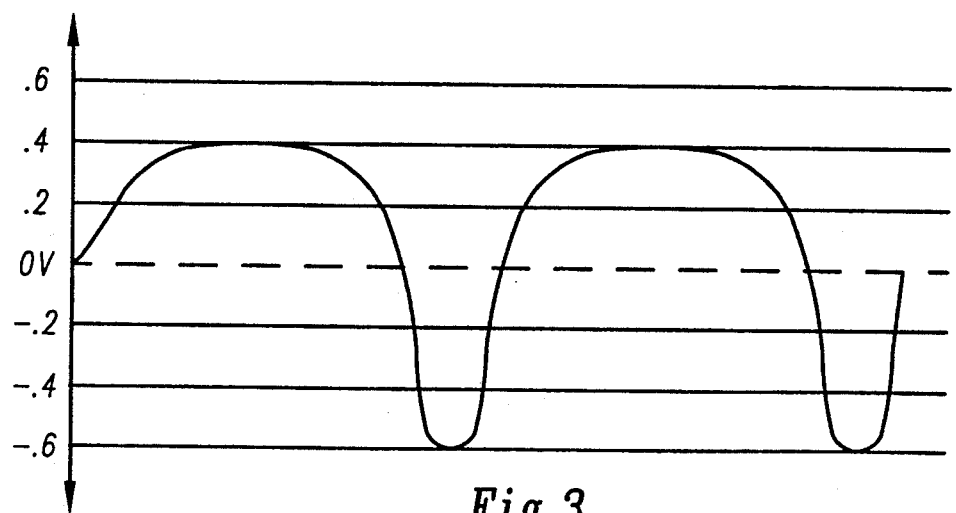
Fig.3

DEMODULATOR ALIGNMENT METHOD AND APPARATUS

FIELD OF THE INVENTION

The present invention generally pertains to data recovery, and in particular to demodulator circuitry for use within a data recovery system.

BACKGROUND OF THE INVENTION

The use of quadrature demodulator circuits to assist in data detection is well known in the data communications art. Quadrature demodulators typically employ delay elements whose frequency of operation must be aligned with the input signal (i.e., carrier signal) center frequency in order to avoid distortion at the demodulator output. Since this alignment has heretofore been a manual operation requiring human interaction, the process may be fairly characterized as highly subjective and prone to error.

Another concern with manual demodulator alignment procedures is the inability to maintain their integrity over long periods of operation. Factors such as mechanical stress and thermal cycling tend to degrade a demodulator's performance over time. Consequently, periodic realignments, while undesirable and costly, are nonetheless necessary to insure proper performance.

Based on the foregoing, a need exists for a demodulator alignment method and/or apparatus that continuously aligns a demodulator circuit thereby avoiding the shortcomings of the prior art.

SUMMARY OF THE INVENTION

Briefly described the present invention is a demodulator alignment method and apparatus. In this effort, an alignment signal generator is employed to generate a modulated alignment signal in response to a modulation reference signal. The modulated alignment signal is demodulated by a demodulator circuit, having a voltage controlled delay element, to produce a demodulated output signal having distortion components.

In accordance with one embodiment, a differential amplifier is employed to combine an amplified version of the demodulated alignment signal with a delayed version of the modulation reference signal to form an error signal substantially representative of the distortion components. Next a sampling circuit samples the error signal to generate a sampled error signal. The sampled error signal is then applied to the voltage controlled delay element as a correction voltage in order to minimize the distortion components at the demodulator output during data recovery.

In accordance with another embodiment, the demodulated alignment signal is coupled to a filter for isolating the distortion components. Thereafter, a detector is employed to detect the isolated distortion components. Next, an error amplifier, which compares the detected distortion to a reference, provides an error signal to a sampling circuit. The sampling circuit samples the error signal to generate a sampled error signal. The sampled error signal is then applied to the voltage controlled delay element as a correction voltage in order to minimize the distortion components at the demodulator output during data recovery.

In accordance with yet another embodiment, the demodulated alignment signal is AC coupled to a detector which detects amplitude fluctuations in the AC coupled signal. Thereafter, a differential amplifier is employed to generate a difference signal as a function of the detected amplitude fluctuations. Next, an error amplifier is employed to produce an error signal as a function of the difference signal. The error signal is then sampled by a sampling circuit which generates a sampled error signal. The sampled error signal is then applied to the voltage controlled delay element as a correction voltage in order to minimize the distortion components at the demodulator output during data recovery.

BRIEF DESCRIPTION OF THE DRAWINGS

FIG. 1 depicts a wave form diagram of a multi-level data symbol signal;

FIG. 2 depicts a demodulated sinusoidal wave form that illustrates demodulator misalignment in a direction below the desired operating frequency level;

FIG. 3 depicts a demodulated sinusoidal wave form that illustrates demodulator misalignment in a direction above the desired operating frequency level;

DETAILED DESCRIPTION OF THE INVENTION

Figure 4:
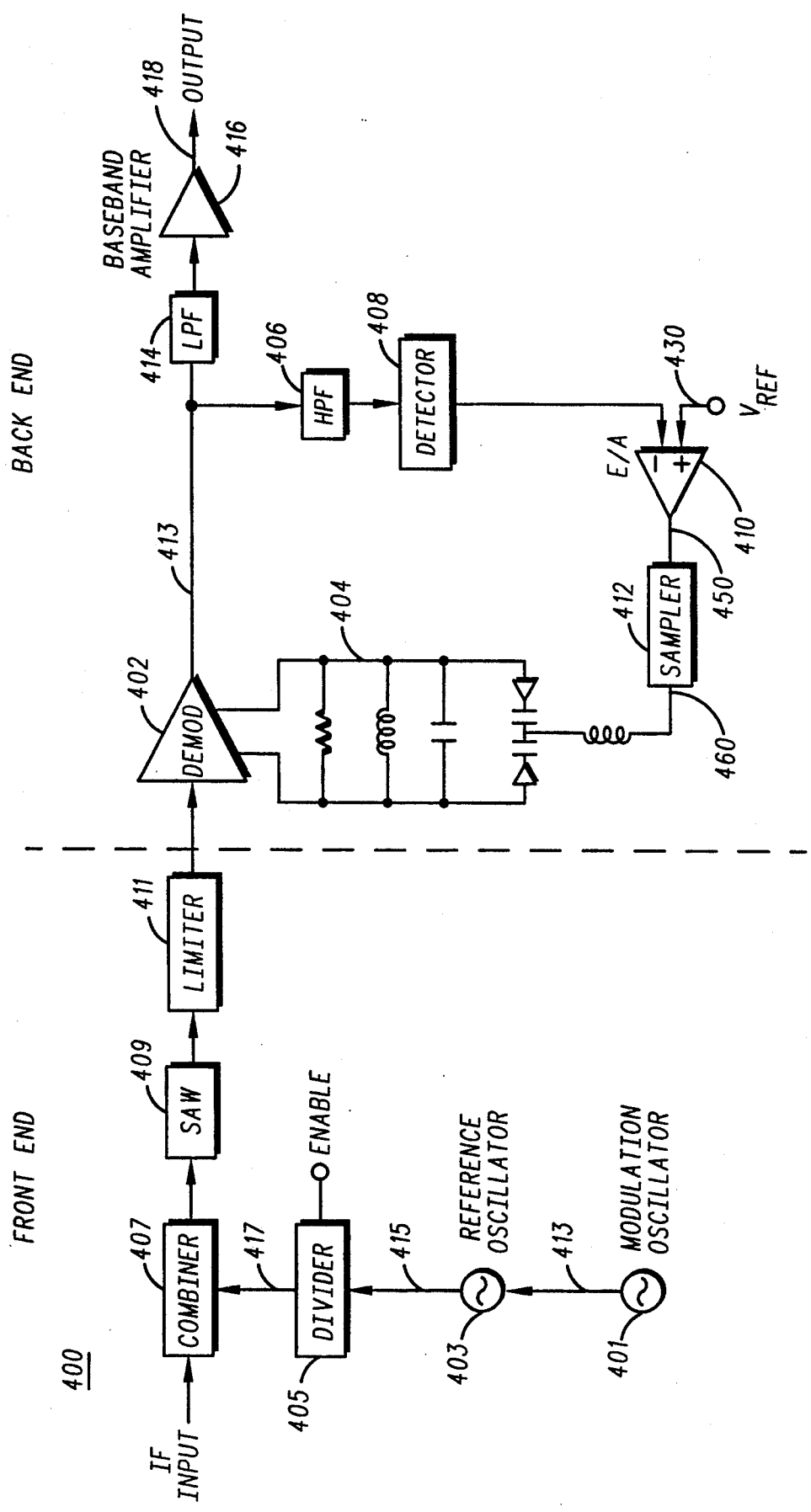
FIG. 4 illustrates a demodulator alignment circuit in accordance with the present invention.

FIG. 1 depicts a wave form diagram of a multi-level data signal 100 including bit values and their corresponding voltage levels. This particular multi-level data symbol signal illustrates five different levels; a predetermined reference voltage at zero volts and four discrete threshold voltage levels (decision levels) which correspond to the following binary representations:

"00" at the most negative level ($-0.063$ V nominal),
"01" at a first negative level ($-0.21$ V nominal),
"10" at a first positive level ($+0.21$ V nominal), and
"11" at the most positive level ($+0.63$ V nominal).

The multi-level data signal 100 is representative of an output signal for a quadrature demodulator like those described below. The number of voltage levels and the binary values assigned in accordance with FIG. 1 are provided for illustrative purposes only.

In data communication systems employing very high speed data rates ($>1$ mbs), multi-level data is difficult to correctly recover. As will be appreciated, data recovery requires applying the signal 100 to an analog to digital (A/D) converter which, using zero volts as a center reference, detects the data signal voltage levels and converts them into their equivalent binary representations. For accurate detection of the multi-level data signal 100 or any other Frequency Shift Keyed (FSK) signal, the demodulator's center frequency must remain aligned with the center frequency of the multi-level data input signal (carrier frequency). Alignment with respect to the demodulation of multi-level data or FSK signals may be defined as:

for a given positive or negative deviation in the input signal
center frequency (either IF or RF) a proportional deviation in demodulator amplitude must occur.

As an example, for an input signal centered at 100 MHz, if the demodulator must produce $+1.0$ volts for a positive deviation of 5 MHz, then the demodulator must produce −1.0 volts for a negative deviation of 5 MHz. In an incorrectly aligned demodulator the multi-level data signal wave form 100 is characterized by distortion (harmonic energy components) which makes level detection prone to error.

FIGS. 2 and 3 are examples of demodulated sinusoidal wave forms subject to distortion from demodulator misalignment. FIG. 2 depicts the output wave form of a quadrature demodulator whose frequency of operation (center frequency) is adjusted for resonance below the desired center frequency. FIG. 3 depicts the output wave form of a quadrature demodulator whose frequency of operation is adjusted for resonance above the desired center frequency. In both cases, when a sinusoidally deviating signal is applied to the quadrature demodulator circuit, the distortion of the ideal demodulated sine wave is sufficient enough to reduce receiver sensitivity and adversely impact carrier to interference (C/I) detection performance. For multi-level data detection, this type of distortion greatly reduces the likelihood of correct detection of the various decision levels. Other types of signal distortion like noise and multipath can also quite easily cause the erroneous detection of decision levels if the demodulator is less than optimally aligned.

In order to overcome the problems associated with prior alignment schemes, FIG. 4 illustrates a preferred embodiment of a demodulator alignment circuit 400 in accordance with the present invention. Such a circuit has general applicability within the field of data recovery. While additional circuitry and components are typically required to complete such a data recovery system, the following discussion will concentrate primarily upon the demodulator portion thereof.

The demodulator alignment circuit 400 of FIG. 4 may be divided into front and back end sections. The front end section comprises a modulated alignment signal generator. This signal generator consists of sinusoidal modulation oscillator 401, reference oscillator 403, and a divide by two flip flop 405. The remainder of the front end includes the resistive power combiner 407, SAW filter 409, and IF amplifier/limiter stage 411. The back end section comprises a demodulator circuit 402 with associated voltage controlled delay (VCD) element 404, high pass filter 406, detector 408, error amplifier 410, and sampling circuit 412. In addition, the back end comprises a wave form shaping and a amplification stage comprising low pass filter 414 and base band amplifier 416. Advantageously, the demodulator alignment circuit of the present invention eliminates the need for manual adjustment and subsequent manual realignment of the demodulator circuit's frequency of operation, as established by the VCD element 404.

Operation of the overall circuit is as follows. Assuming the circuit 400 is employed within the receiver section of a data recovery system, the modulated alignment signal 417 is most advantageously applied when the receiver is not receiving recoverable data. In this effort, the modulation oscillator 401 modulates the reference oscillator 403 with the modulation reference signal 413 to produce a modulated reference signal 415. The modulation reference signal 413 may comprise any of the well known modulation reference wave form types. In accordance with the preferred embodiment, the modulation reference signal 413 is a sinusoid. In response thereto, the reference oscillator 403 provides a 20 MHz sinusoidally modulated reference signal 415. This reference is applied to a divide by two flip flop 405 that is controlled by a gating signal labeled ENABLE.

When the flip flop 405 is in the enabled state, it operates to convert the 20 MHz reference signal 415 into a 10 MHz sinusoidally modulated square wave signal 417. The 10 MHz square wave 417, hereinafter referred to as the alignment signal 417, is rich in harmonic content and is ideal for providing the desired 70 MHz signal for use in demodulator alignment as described below. When the flip flop 405 is in the disabled state, the 20 MHz reference signal 415, which is devoid of significant harmonic components, is attenuated by the divider 405 so as not to interfere with normal operation. Consequently, ENABLE signal gating is employed to apply the demodulator alignment signal 417 to the back end section of the alignment circuit 400 when the receiver is not required to receive recoverable data. When the receiver is receiving recoverable data, alignment signal 417 generation is effectively disabled by failing to convert the 20 MHz sinusoidal reference signal 415 into the 10 MHz square wave alignment signal 417.

When enabled, the divider 405 applies the alignment signal 417 to the resistive power combiner 407 which routes the signal to SAW filter 409 which strips off the desired harmonic for use in demodulator alignment. The desired 70 MHz reference from the SAW filter 409 is then applied to the IF amplifier/limiter stage 411, which amplifies the alignment signal prior to presentation to the demodulator 402.

After demodulation, the demodulated alignment signal 419 is applied to the high pass filter 406. The high pass filter 406 is used to remove most of the fundamental frequency components from the base band wave form and allow only the harmonic components thereof to pass through. At this point the demodulator circuit 402 has not converged to an aligned state, thus, there is a significant amount of energy present in the harmonic components of the demodulated signal 419. The harmonic energy from the high pass filter 406 is detected by the detector 408. In accordance with the preferred embodiment, harmonic energy detection is accomplished through the use of a rectifying detector such as a biased diode detector, an AM detector or a matched filter detector. The detected harmonic energy is then applied to an error amplifier 410 which compares the detected harmonic energy to a reference 430 and produces in response thereto an error signal 450 that is proportional to the error or difference between the two applied signals. Next, the error signal 450 is sampled by a sampling circuit 412 such as a sample and hold circuit, an A/D-D/A converter or a digital memory device which stores the error value until a new sample can be taken.

In effect, the sampled error signal 460 is buffered and later applied to the VCD element 404 of the demodulator 402 as a correction voltage 460 during the demodulation of recoverable data. As will be appreciated, application of the correction voltage to the VCD element 404 alters the demodulator circuit's frequency to voltage transfer function. In accordance with the preferred embodiment, the VCD element 404 is a tank circuit. All pass filter phase shift networks and selectable tap delay lines are other viable alternative.

Over time, the action of the above described feed back circuit is to minimize the harmonic energy detected by the detector 408 and thereby maintain demodulator 402 alignment. Since this process is occurring on a continuous basis the demodulated signal 419 is kept in a constantly aligned state and cannot drift due to aging or mechanical stress. Of note, this embodiment has application to any demodulator requiring accurate control of phase and amplitude in either IF or base band components.

Figure 5:
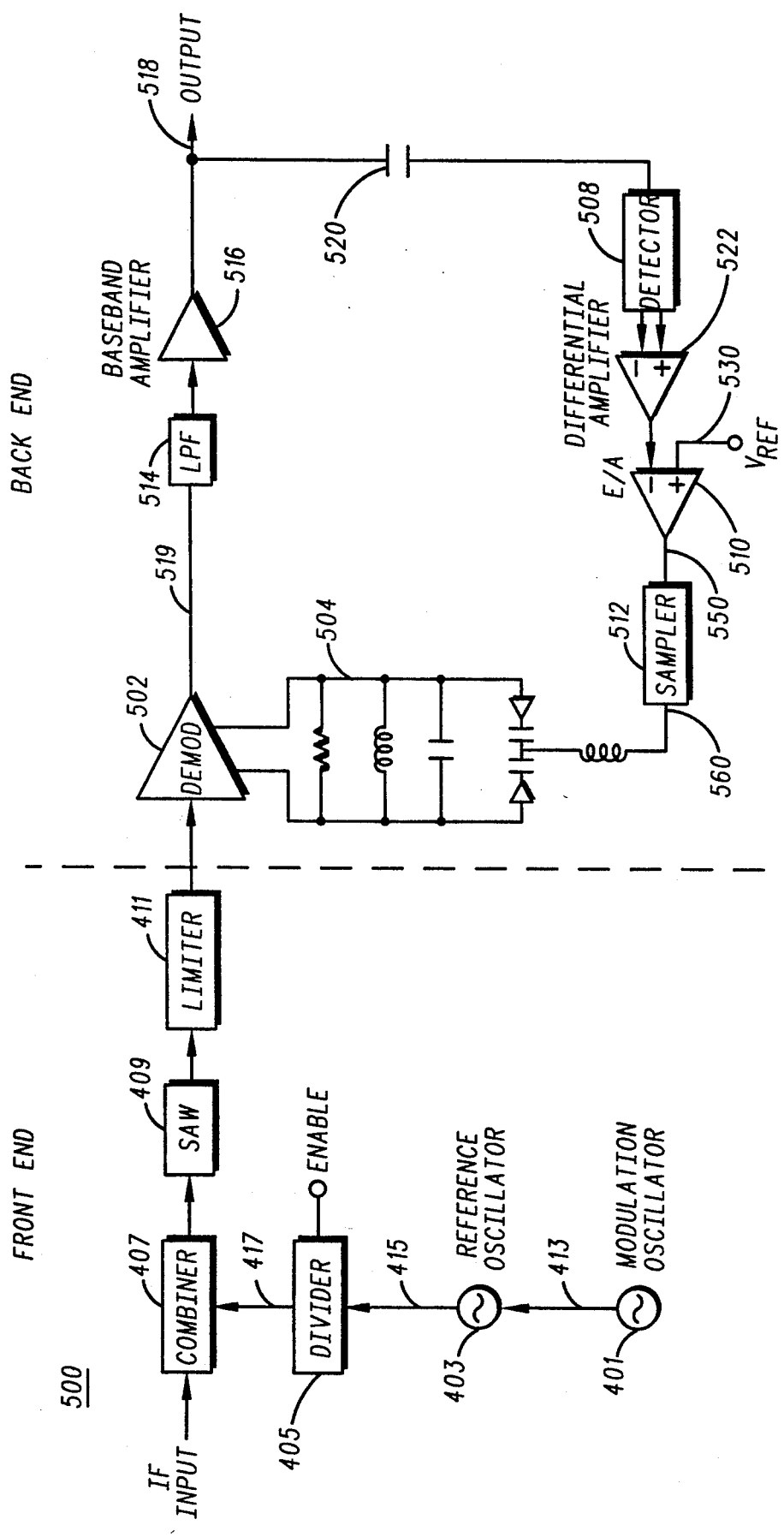
FIG. 5 illustrates an alternative embodiment of a demodulator alignment circuit in accordance with the present invention.

FIG. 5 illustrates an alternative embodiment of a demodulator alignment circuit in accordance with the present invention. The demodulator alignment circuit 500 of FIG. 5 comprises a front end section 401–417 that works substantially in accordance with the description of FIG. 4. The back end section comprises a demodulator circuit 502 with associated voltage controlled delay (VCD) element 504, a shaping/amplification stage comprising a low pass filter 514 and base band amplifier 516, coupling capacitor 520, detector 508, differential amplifier 522, error amplifier 510, and sampling circuit 512.

Operation of the back end section proceeds as follows. A modulated alignment signal 417 is applied to the demodulator circuit 502 for demodulation. Assuming this circuit 500 is employed within the receiver section of a data recovery system, the alignment signal 417 is most advantageously applied during those periods when the receiver is not receiving recoverable data.

After demodulation, the demodulated alignment signal wave form 519 is applied to the shaping/amplification stage comprising low pass filter 514 and base band amplifier 516 which provide symbol shaping and base band amplification, respectively. For alignment purposes, the output wave form 518 is capacitively coupled to a detector 508 via coupling capacitor 520. As will be appreciated, the AC coupled output signal 518 will consist of positive and negative peak excursions. Detection of these signals is accomplished via dual polarity detector 508 which provides two rectified outputs, proportional to the positive and the negative peak excursion of the demodulated wave form, respectively. The detected signals are then applied to a differential amplifier 522 which detects the difference between the positive and negative peak excursions and produces a difference signal in response thereto. This difference signal is then applied to an error amplifier 510 which compares the difference signal to a reference 530 and produces an error signal 550 that is proportional to the magnitude and the polarity of the difference signal. The error signal 550 is then sampled by a sampling circuit 512 such as a sample and hold circuit, an A/D-D/A converter or a digital memory device, which stores the sampled error signal until a new sample can be taken. Thus, the error signal 550 is buffered and later applied to the VCD element 504 of the demodulator 502 as a correction voltage 560 during the demodulation of recoverable data.

Figure 6:
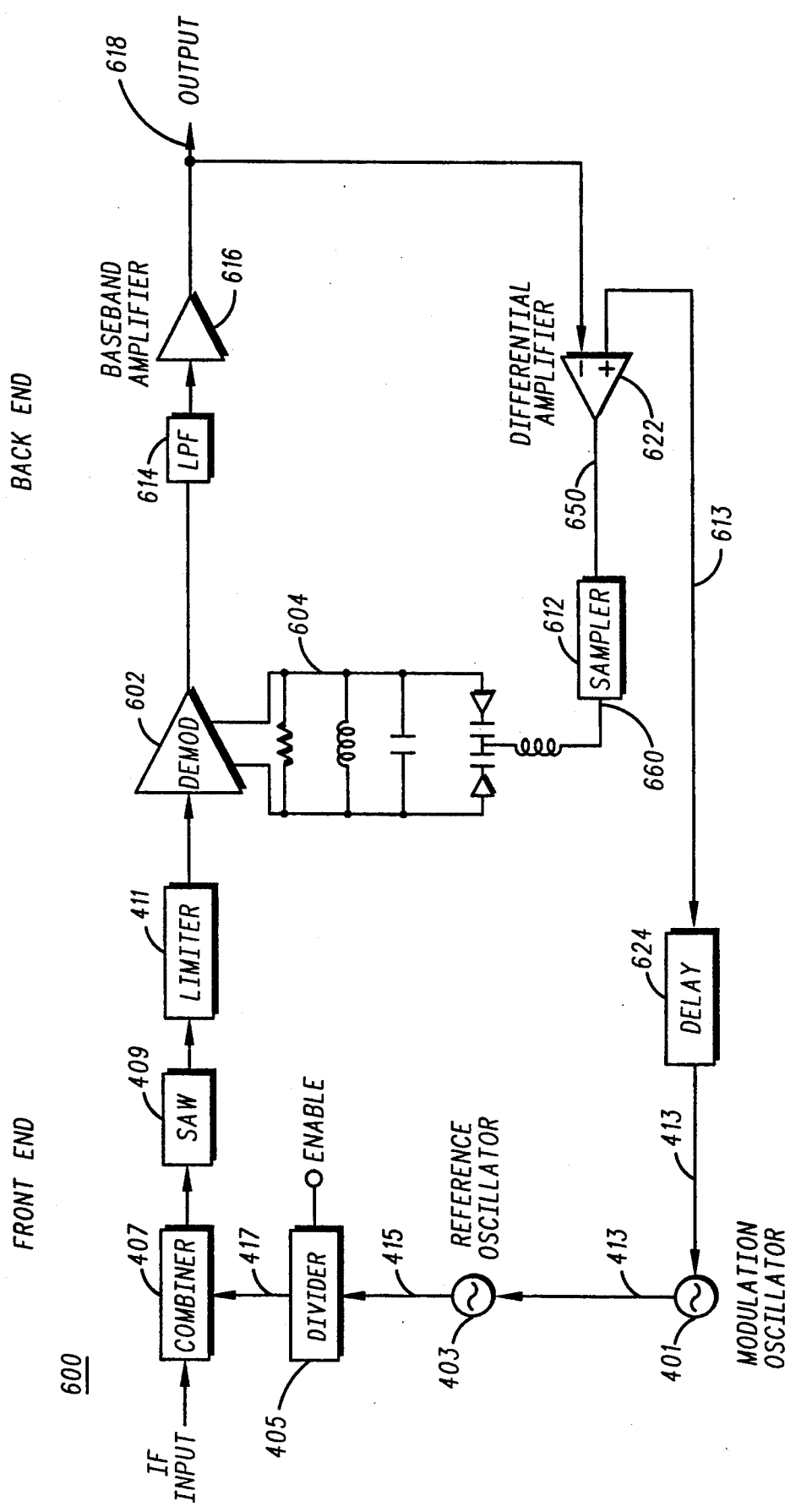
FIG. 6 illustrates yet another embodiment of a demodulator alignment circuit in accordance with the present invention.

FIG. 6 depicts yet another embodiment of a demodulator alignment circuit 600 in accordance with the present invention. This embodiment operating to eliminate the need for manual adjustment and eventual realignment of the demodulator circuit 602, regardless of the type of wave form applied as a modulation to reference signal (i.e. sinusoid, square, triangular). The circuit 600 comprises a front end section 401–417 that works substantially in accordance with the description of FIG. 4. In addition, the front end section of the circuit 600 further comprises a delay element 624. The back end section of the circuit 600 comprises a demodulator circuit 602 with accompanying VCD element 604, low pass filter 614, base band amplifier 616, and differential amplifier 622.

Operation of this circuit proceeds as follows. A modulated alignment signal 417 is applied to demodulator 602 of the circuit 600 for demodulation. Assuming this circuit is employed within the receiver section of an RF transceiver, the alignment signal is applied during the transmit mode of operation (i.e., when the receiver is not receiving recoverable data). After demodulation, the demodulated reference signal is applied to a shaping/amplification stage consisting of the low pass filter 614 and base band amplifier 616. These blocks serve to provide symbol shaping and base band amplification for the output signal 618. The output signal 618 is then routed to differential amplifier 622.

For alignment purposes, a delay circuit 624 is employed to provide a delayed version 613 of the modulation reference signal 413 to the differential amplifier 622. The delay circuit 624 assures that the delayed version 613 of the modulation reference signal 413 arrives at the differential amplifier 622 in phase with the demodulated output signal 618. The differential amplifier 622 compares the two input signals and produces a difference or error signal 650 that is proportional to the difference between the two applied signals. The error signal 650 is sampled by a sampling circuit 612, buffered, and then applied to the tank circuit 604 of the demodulator 602 as a correction voltage 660 during the demodulation of recoverable data.

In a TDMA system, over a period of several frames, the action of this feedback circuit is to cause the output of the demodulator to converge to a state of minimum detected amplitude and phase deviation at the differential amplifier output. This is equivalent to the state of minimum differential gain variation across the deviated spectrum and is by definition the aligned state for the demodulator 602. Since this process is occurring on a continuous frame by frame basis the demodulated signal 618 is kept in a constantly aligned state and cannot drift due to aging or mechanical stress.

What is claimed is:

1. A demodulator alignment circuit comprising:
   means, for generating an alignment signal in response to a modulation reference signal;
   a demodulator, having voltage controlled delay element, coupled to the means for generating the alignment signal, for demodulating the alignment signal to produce a demodulated output signal having distortion components;
   a base band amplifier, coupled to the demodulator, for amplifying the demodulated output signal;
   a differential amplifier, coupled to the base band amplifier, for combining the amplified output signal with a delayed version of the modulation reference signal to form an error signal substantially representative of the distortion components; and
   sampling means, coupled to the differential amplifier, for sampling the error signal and applying the sampled error signal to the voltage controlled delay element as a correction voltage in order to minimize the distortion components at the demodulator output.

2. The circuit of claim 1 wherein the means for generating the alignment signal further comprises gating means for enabling and disabling alignment signal generation.

3. The circuit of claim 1 wherein the voltage controlled delay element is selected from the group consisting of:
   tank circuits;

all pass filters; and selectable tap delay lines.

4. The circuit of claim 1 wherein the demodulator is a quadrature demodulator.

5. The circuit of claim 1 wherein the sampling means is a device selected from the group consisting of:
   sample and hold circuits;
   D/A-A/D converters; and
   digital storage devices.

6. The circuit according to claim 1 further comprising a low pass filter disposed between the demodulator and the base band amplifier to provide wave form shaping.

7. In a receiver, a demodulator alignment circuit comprising:
   a demodulator, having a voltage controlled delay element, said demodulator responsive to a modulated alignment signal for generating an output signal having distortion components;
   a filter, coupled to the demodulator, for filtering the output signal to isolate the distortion components;
   a detector, coupled to the filter, for detecting the isolated distortion components;
   an error amplifier, coupled to the detector, for providing an error signal proportional to the detected distortion components; and
   sampling means, coupled to the error amplifier, for sampling the error signal and applying the sampled error signal to the voltage controlled delay element as a correction voltage in order to minimize distortion at the demodulator output.

8. The circuit of claim 7 wherein the voltage controlled delay element is selected from the group consisting of:
   tank circuits;
   all pass filters;
   selectable tap delay lines.

9. The circuit of claim 7 wherein the demodulator is a quadrature demodulator.

10. The circuit of claim 7 wherein the filter is a high pass filter.

11. The circuit of claim 7 wherein the detector is a device selected from the group consisting of:
    AM detectors;
    diode detectors;
    rectifying detectors;
    peak detectors;
    harmonic energy detectors; and
    matched filter detectors.

12. The circuit of claim 7 wherein the sampling means is a device selected from the group consisting of:
    sample and hold circuits;
    D/A-A/D converters; and
    digital storage devices.

13. The circuit of claim 7 wherein the error amplifier is a DC amplifier.

14. The circuit of claim 7 further comprising means for generating the modulated alignment signal, in response to a modulation reference signal.

15. The circuit according to claim 14 wherein the means for generating the modulated alignment signal further comprises gating means for disabling the generation of the modulated alignment signal when the receiver is receiving recoverable data.

16. In an RF receiver, a demodulator alignment circuit comprising:
    a demodulator having a voltage controlled delay element, for demodulating a modulated alignment signal;
    a base band amplifier, coupled to the demodulator, for amplifying the demodulated output signal;
    a detector, AC coupled to the base band amplifier, for detecting amplitude fluctuations in the AC coupled demodulated output signal;
    a differential amplifier, coupled to the detector, for generating a different signal;
    an error amplifier, coupled to the differential amplifier for generating an error signal as a function of the difference signal; and
    sampling means, coupled to the the error amplifier, for sampling the error signal and applying the sampled error signal to the voltage controlled delay element as a correction voltage in order to minimize the amplitude fluctuations of the AC coupled demodulated output signal.

17. The circuit of claim 16 further comprising a low pass filter disposed between the demodulator and the base band amplifier to provide wave form shaping.

18. The circuit of claim 16 wherein the detector is a dual-polarity detector.

19. The circuit of claim 16 further comprising means for generating the modulated alignment signal, in response to a modulation reference signal.

20. The circuit according to claim 19 wherein the means for generating the modulated alignment signal further comprises gating means for disabling the generation of the modulated alignment signal when the RF receiver is receiving recoverable data.

21. In an RF transceiver having transmit and receive modes of operation, a method for aligning a demodulator having a voltage controlled delay element comprising the steps of:
    during the transmit mode;
        generating a modulated alignment signal in response to a modulation reference signal;
        demodulating the modulated alignment signal to produce a demodulated output signal having distortion components;
        generating an error signal proportional to the distortion components of the demodulated output signal;
        sampling the error signal to generate a sampled error signal; and during the receive mode:
        disabling generation of the modulated alignment signal; and
        applying the sampled error signal to the voltage controlled delay element as a correction voltage in order to minimize the distortion components at the demodulator output.

22. The method of claim 21 wherein the step of generating an error signal proportional to the distortion components further comprises the step of:
    filtering the demodulated output signal to isolate the distortion components;
    detecting the isolated distortion components; and
    comparing the detected distortion components to a reference signal in order to provide the error signal.

23. The method of claim 21 wherein the step of generating an error signal proportional to the distortion components further comprises the step of:
    AC coupling the demodulated output signal to a dual-polarity detector for detecting amplitude fluctuation in the AC coupled signal;

generating a difference signal as a function of the detected amplitude fluctuation; and comparing the difference signal to a reference signal in order to provide the error signal.

24. In an RF transceiver having transmit and receive modes of operation, a method for aligning a demodulator having a voltage controlled delay element comprising the steps of:

during the transmit mode;

generating a modulated alignment signal in response to a modulation reference signal;

demodulating the modulated alignment signal to produce a demodulated output signal having distortion components;

comparing the demodulated output signal with a delayed version of the modulation reference signal to form an error signal substantially representative of the distortion components;

sampling the error signal to provide a sampled error signal; and during the receive mode:

disabling generation of the modulated alignment signal; and applying the sampled error signal to the voltage controlled delay element as a correction voltage in order to minimize distortion components at the demodulator output.

25. The method according to claim 24 further comprising the steps of:

filtering the demodulated output signal to provide wave form shaping; and amplifying the wave form shaped demodulated signal prior to the step of comparing.

* * * * *